United States Patent
Saripella et al.

[11] Patent Number: 5,978,280
[45] Date of Patent: Nov. 2, 1999

[54] METHOD, ARCHITECTURE AND CIRCUIT FOR REDUCING AND/OR ELIMINATING SMALL SIGNAL VOLTAGE SWING SENSITIVITY

[75] Inventors: Satish C. Saripella, Starkville; Jeffery Scott Hunt, Ackerman, both of Miss.; Sudhaker Reddy Anumula, Sunnyvale, Calif.; Ajay Srikrishna, Starkville, Miss.

[73] Assignee: Cypress Semiconductor Corp., San Jose, Calif.

[21] Appl. No.: 09/132,100

[22] Filed: Aug. 10, 1998

Related U.S. Application Data

[63] Continuation of application No. 09/104,918, Jun. 25, 1998.
[51] Int. Cl.$^6$ .................................................. G11C 13/00
[52] U.S. Cl. ................................. 365/189.05; 365/189.09
[58] Field of Search ........................ 365/189.01, 189.09, 365/189.05, 210, 233

[56] References Cited

U.S. PATENT DOCUMENTS

| | | | |
|---|---|---|---|
| 5,193,076 | 3/1993 | Houston | 365/233.5 |
| 5,291,447 | 3/1994 | Kodama et al. | 365/190 |
| 5,309,395 | 5/1994 | Dickinson et al. | 365/189.04 |
| 5,325,337 | 6/1994 | Buttar | 365/210 |
| 5,388,075 | 2/1995 | Vinal | 365/189.05 |
| 5,394,361 | 2/1995 | Dickinson | 365/189.04 |
| 5,473,565 | 12/1995 | Kusakari | 365/189.01 |
| 5,473,568 | 12/1995 | Okamura | 365/210 |
| 5,479,374 | 12/1995 | Kobayashi et al. | 365/233.5 |
| 5,502,681 | 3/1996 | Park | 365/210 |
| 5,508,604 | 4/1996 | Keeth | 365/189.09 |
| 5,544,101 | 8/1996 | Houston | 365/189.02 |
| 5,559,752 | 9/1996 | Stephens, Jr. et al. | 365/233 |
| 5,596,539 | 1/1997 | Passow et al. | 365/210 |
| 5,604,705 | 2/1997 | Ackland et al. | 365/205 |
| 5,610,862 | 3/1997 | Teel | 365/189.05 |
| 5,625,595 | 4/1997 | Ikeda | 365/194 |
| 5,644,773 | 7/1997 | Sawada | 365/233 |
| 5,659,513 | 8/1997 | Hirose et al. | 365/205 |
| 5,661,417 | 8/1997 | Kondoh | 365/87 |
| 5,661,691 | 8/1997 | Lin | 365/208 |
| 5,717,653 | 2/1998 | Suzuki | 365/233 |
| 5,724,287 | 3/1998 | Takenaka | 365/191 |
| 5,729,503 | 3/1998 | Manning | 365/233.5 |
| 5,742,552 | 4/1998 | Greenberg | 365/210 |
| 5,745,419 | 4/1998 | Brauch | 365/201 |
| 5,748,544 | 5/1998 | Hashimoto | 365/201 |
| 5,751,170 | 5/1998 | Pyeon | 327/57 |
| 5,752,270 | 5/1998 | Wada | 711/169 |
| 5,754,481 | 5/1998 | Yabe et al. | 365/189.05 |
| 5,757,718 | 5/1998 | Suzuki | 365/233.5 |
| 5,761,136 | 6/1998 | Park et al. | 365/191 |

OTHER PUBLICATIONS

Hunt et al., Self–Timed Sense Amplifier Evaluation Scheme, Jun. 24, 1998, U.S.S.N. 09/103,960.

Jeffrey S. Hunt et al., U.S.S.N. 09/107,000 Method, Architecture and Circuit for Writing to and Reading from a Memory During a Single Cycle, filed Jun. 29, 1998.

Jeffrey S. Hunt et al. U.S.S.N. 09/106,806 Method, Architecture and Circuit for Writing to a Memory, filed Jun. 29, 1998.

Satish Saripella et al., U.S.S.N. 09/126,832 Wordline Synchronized Reference Voltage Generator, filed Jul. 31, 1998.

Jeffrey S. Hunt et al., U.S.S.N. 09/103,960 Self–Timed Sense Amplifier Evalution Scheme, filed Jun. 24, 1998.

*Primary Examiner*—Terrell W. Fears
*Attorney, Agent, or Firm*—Christopher P. Maiorana, P.C.

[57] ABSTRACT

A circuit comprising a sense amplifier, an evaluation circuit, a control circuit and a register circuit. The sense amplifier circuit may be configured to present a first output and a second output in response to (i) an input signal and (ii) an enable signal. The evaluation circuit may be configured to present an evaluation signal in response to the first and second outputs. The control circuit may be configured to present (i) a first clock signal, a second clock signal and an enable signal in response to (i) the evaluation signal and (ii) a wordline signal. The register circuit may be configured to hold either the first or second output in response to the first and second clock signals. The register circuit may be implemented as a master-slave register that may respond to the first and second clock signals.

17 Claims, 4 Drawing Sheets

METHOD, ARCHITECTURE AND CIRCUIT FOR REDUCING AND/OR ELIMINATING SMALL SIGNAL VOLTAGE SWING SENSITIVITY

This application is a continuation of application Ser. No. 09/104,918, filed Jun. 25, 1998.

FIELD OF THE INVENTION

The present invention relates to memory devices generally and, more particularly, to a method, architecture and circuit for reducing and/or eliminating small signal voltage swing sensitivity to output noise in a memory.

BACKGROUND OF THE INVENTION

Memory devices can use a voltage difference between differential bitlines to sense the current state of a memory cell. For designs with small differential bitline levels, the output noise can feedback onto the bitlines and may collapse the bitline and TBUS differential signal levels. Due to the collapsed TBUS differential signal, an incorrect state could be sensed by the sense amplifier which can cause an output glitch, or even multiple output glitches. Static bitline load designs have poor noise immunity for small bitline voltage swings. The bitline voltage swing is presented to the TBUS through a switch.

Referring to FIG. 1, a circuit 10 illustrates a static bitline load design block diagram. The circuit 10 comprises an address path block 12, a memory array block 14, a sense amplifier block 16 and an output path block 18. The address path block 12 presents a wordline signal WL in response to an address signal. The memory array block 14 presents a signal TBUS in response to the signal WL. The sense amplifier block 16 presents a signal SAOUT in response to the signal TBUS. The output path block 18 presents a signal OUTPUT in response to the signal SAOUT.

Referring to FIG. 2, a timing diagram of the signals of FIG. 1 is shown. A signal ADDRESS has a transition 20 that indicates an external address has changed state. The signal WL has a positive transition 22 that responds to the transition 20 of the signal ADDRESS. The signal TBUS has a transition 24 that responds to the positive transition 22 of the signal WL. The signal SAOUT has a transition 26 that responds to the transition 24 of the signal TBUS. The signal OUTPUT has a transition 28 that responds to the transition 26 of the signal SAOUT. The signal TBUS has a transition 30 that responds to the transition 28 of the signal OUTPUT. The transition 30 can cause a series of transitions in the signal SAOUT and the signal OUTPUT that may ultimately lead to the sensing of incorrect data. For example, the signal SAOUT has a transition 32 that responds to the transition 30 of the signal TBUS. The signal OUTPUT has a transition 34 that responds to the transition 32 of the signal SAOUT. After a state 35, the signal TBUS has a transition 36 where the TBUS recovers to the correct state. The signal SAOUT has a transition 38 that responds to the transition 36 of the signal TBUS. The signal OUTPUT has a transition 40 that responds to the transition 38 of the signal SAOUT. The signal OUTPUT presents incorrect data between the transition 34 and the transition 40. Furthermore, a collapse of the signal TBUS may occur at a point 42 in response to the transition 34.

A conventional approach to eliminating TBUS sensitivity to output noise is to utilize large bitline swings and use address transition detection circuitry. While such a design may provide better noise immunity than the circuit of FIG. 1, it has other undesirable effects such as limiting the ultimate size of the array due to current constraints.

Referring to FIG. 3, a circuit 50 is shown illustrating such a conventional approach. The circuit 50 comprises an address path block 52, a memory array block 54, a sense amplifier block 56, an output path block 58, an address transition detect block 60 and a control block 62. The address path block 52 presents a signal WL, the memory array block 54 presents a signal TBUS, the sense amplifier block 56 presents a signal SAOUT, the output path block 58 presents a signal OUTPUT, the address transition detect block 60 presents a signal ATD and the control block 62 presents a signal PRCHG and a signal SAEN.

Referring to FIG. 4, a timing diagram of the various signals of FIG. 3 is shown. An external address signal ADDRESS has a transition 64. The signal WL has a transition 66 that responds to transition 64 of the signal ADDRESS. The signal ATD has a positive transition 68 that responds to a transition 64 of the signal ADDRESS. The signal PRCHG has a positive transition 70 that responds to the positive transition 68 of the signal ATD. The signal SAEN has a negative transition 72 that responds to the positive transition 68 of the signal ATD. The signal TBUS has a transition 74 that responds to the positive transition of the signal PRCHG. The signal PRCHG also has a negative transition 76. The signal TBUS has a transition 78 that responds to the negative transition 76 of the signal PRCHG. The signal SAEN has a positive transition 80 that responds to the negative transition 76 of the signal PRCHG. The signal SAOUT has a transition 82 that responds to the positive transition 80 of the signal SAEN. The signal OUTPUT has a transition 84 that responds to the transition 82 of the signal SAOUT. The signal TBUS has a reduced differential portion 87 that responds to the transition 84 of the signal OUTPUT. The signal ADDRESS has a second transition 86. The signal ATD has a positive transition 88 that responds to the transition 86 of the signal ADDRESS. The signal WL has a transition 90 that also responds to the transition 86 of the signal ADDRESS. The signal PRCHG has a positive transition 92 that responds to the positive transition 88 of the signal ATD. The signal TBUS has a transition 94 that responds to the positive transition 92 of the signal PRCHG. The signal PRECHG also has a negative transition 96. The signal TBUS has a transition 98 that responds to the negative transition 96 of the signal PRCHG. The signal SAEN has a negative transition 100 that responds to the positive transition 88 of the signal ATD. The signal SAEN has a positive transition 102 that responds to the negative transition 96 of the signal PRCHG. The signal SAOUT has a transition 104 that responds to the positive transition 102 of the signal SAEN. The signal OUTPUT has a transition 106 that responds to the transition 104 of the signal SAOUT.

Additional conventional approaches may include using an output buffer reference control circuit. Such a reference control circuit may trade off noise control with speed. However, such a reference control circuit may be difficult to design over process corners. Glitch filters may be implemented as another approach to providing noise immunity. However, such glitch filters may have a negative impact on the speed of the device. The addition of split-power busses to isolate noisy power supplies may be implemented as another approach. However, such split-power busses increase the overall die size as well as make the overall power bussing more complex.

SUMMARY OF THE INVENTION

The present invention concerns a circuit comprising a sense amplifier, an evaluation circuit, a control circuit and a register circuit. The sense amplifier circuit may be configured to present a first output and a second output in response to (i) an input signal and (ii) an enable signal. The evaluation circuit may be configured to present an evaluation signal in response to the first and second outputs. The control circuit may be configured to present (i) a first clock signal, a second clock signal and an enable signal in response to (i) the evaluation signal and (ii) a wordline signal. The register circuit may be configured to hold either the first or second output in response to the first and second clock signals. The register circuit may be implemented as a master-slave register that may respond to the first and second clock signals.

The objects, features and advantages of the present invention include a circuit implementing a self-timed sense amplifier evaluation scheme that may generate an evaluation signal that may be used to generate pseudo-synchronous register clocks that may be used internally in an asynchronous design so that the data in the register is isolated from output noise. The circuit may be used with (i) designs with small bitline swing levels, (ii) designs with high I/O pin counts, (iii) single power supplied designs and (iv) asynchronous designs.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
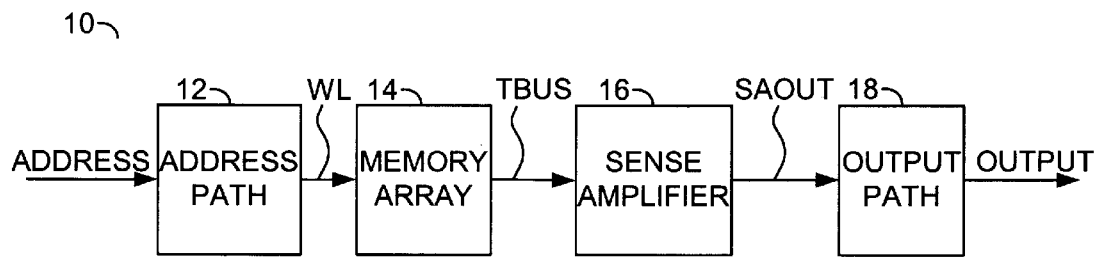
FIG. 1 is a block diagram of a conventional static bitline load design used in a memory.
Figure 2:
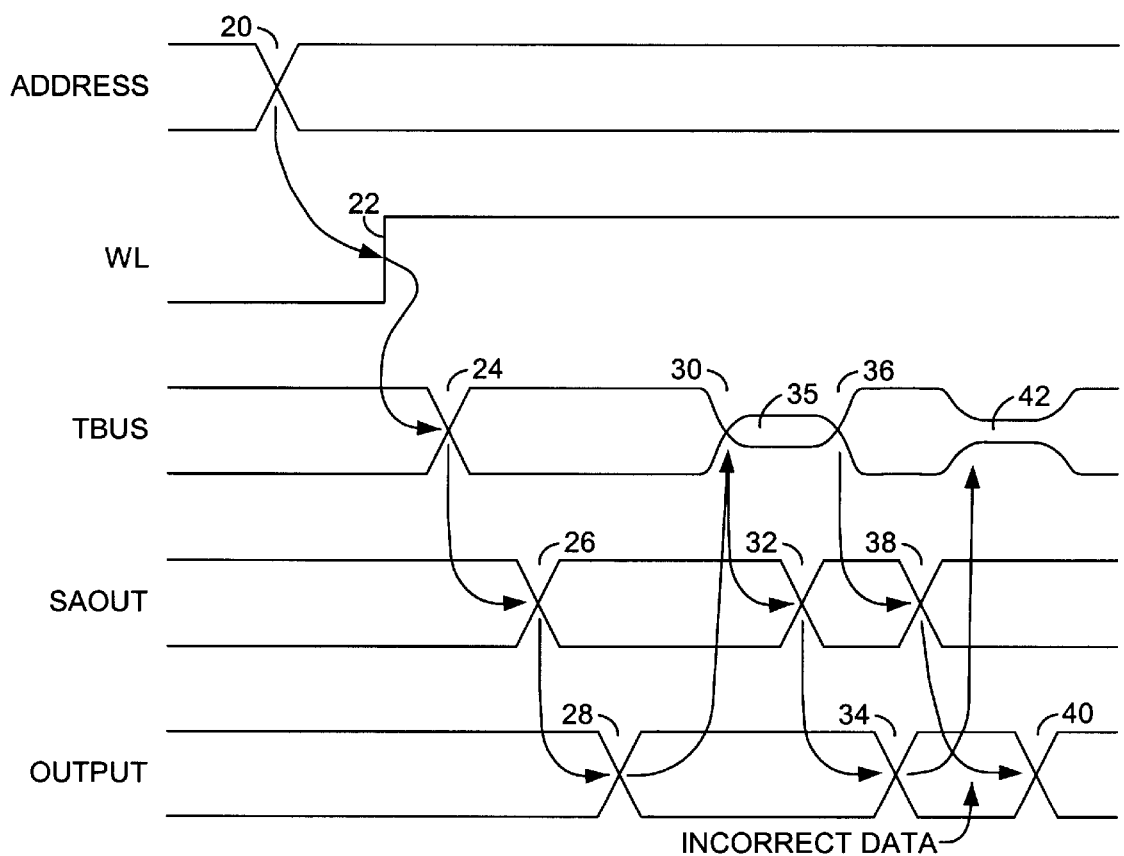
FIG. 2 is a timing diagram of the various waveforms of the circuit of FIG. 1.
Figure 3:
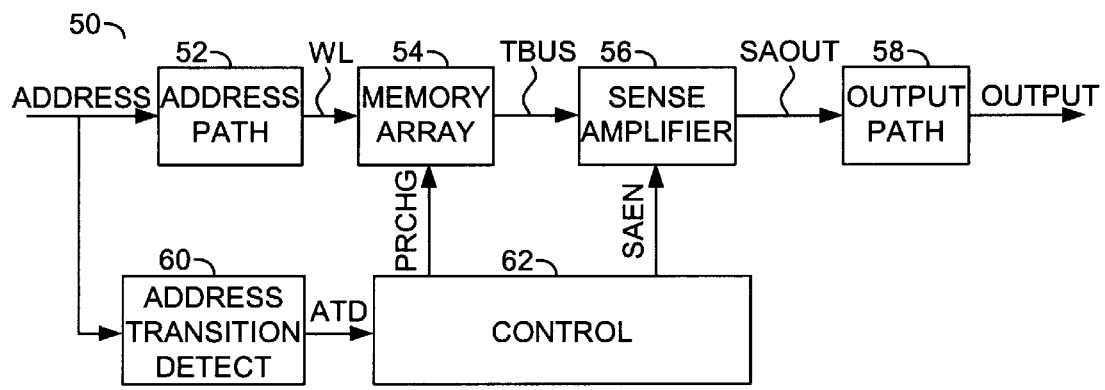
FIG. 3 is a block diagram of a conventional approach to reducing bitline sensitivity to output noise in a memory.
Figure 4:
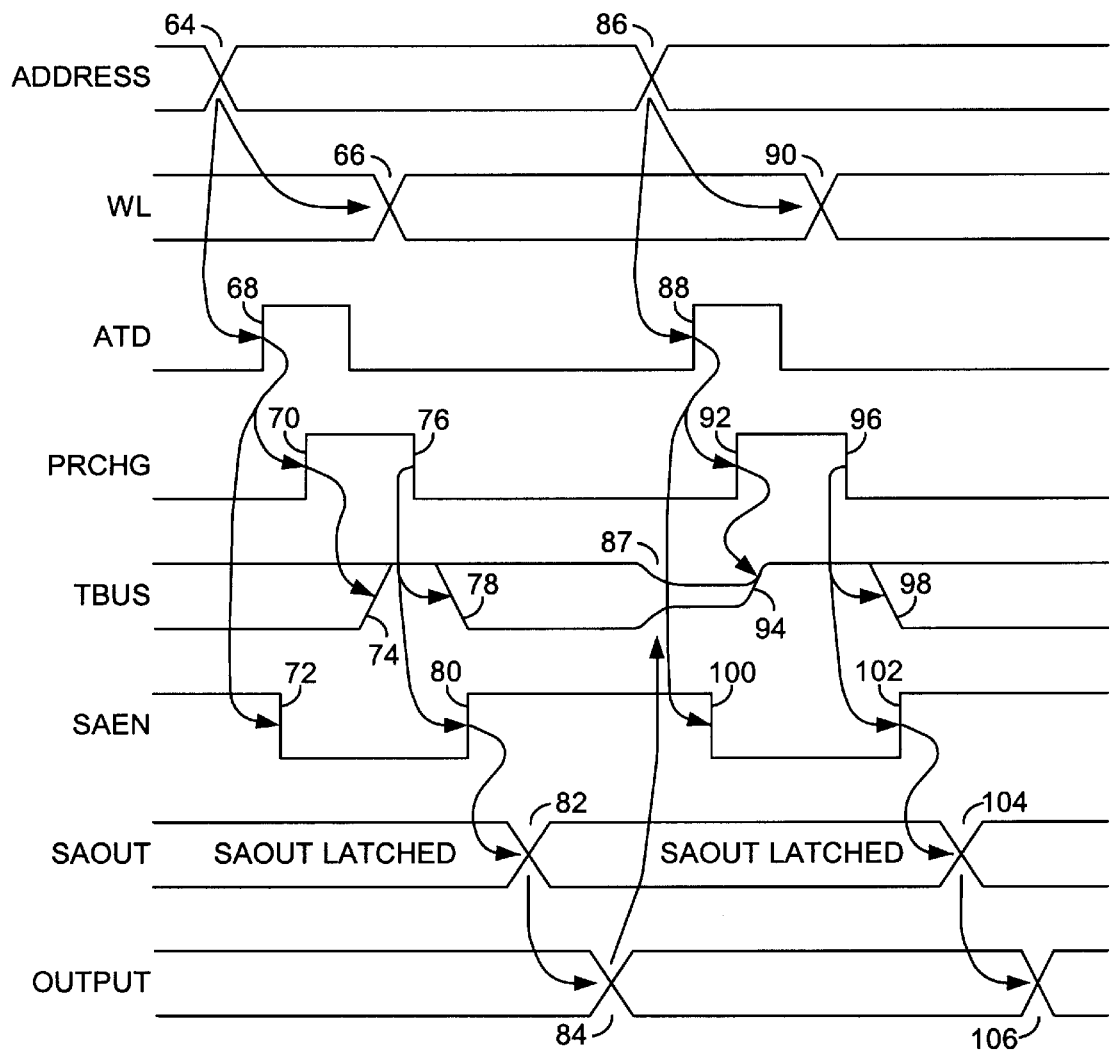
FIG. 4 is a timing diagram of the circuit of FIG. 4.
Figure 5:
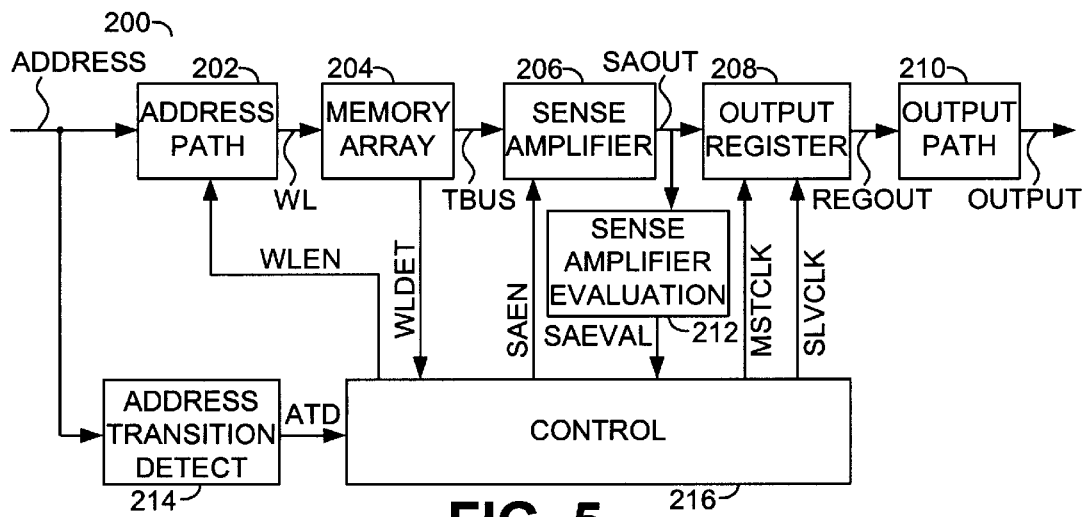
FIG. 5 is a block diagram of a preferred embodiment of the present invention.

Referring to FIG. 5, a circuit 200 is shown in accordance with a preferred embodiment of the present invention. The circuit 200 generally comprises an address path block (or circuit) 202, a memory array block (or circuit) 204, a sense amplifier block (or circuit) 206, an output register block (or circuit) 208, an output path block (or circuit) 210, a sense amplifier evaluation block (or circuit) 212, an address transition detect (ATD) block (or circuit) 214 and a control block (or circuit) 216. The address path block 202 generally presents a wordline signal (e.g., WL) to the memory array block 204. The memory array block 204 generally presents a signal (e.g., TBUS) to the sense amplifier block 206 and a wordline detect signal (e.g., WLDET) to the control block 216. The sense amplifier block 206 generally presents an output signal (e.g., SAOUT) to the output register block 208 as well as to the sense amplifier evaluation block 212. The output register block 208 generally presents an output signal (e.g., REGOUT) to the output path block 210. The output path block 210 presents an output signal (e.g., OUTPUT). The sense amplifier evaluation block 212 generally presents the evaluation signal (e.g., SAEVAL) to the control block 216. The address transition detect block 214 generally presents an address transition detect signal (e.g., ATD) to the control block 216. A control block 216 generally presents a wordline enable signal (e.g., WLEN) to the address path block 202, a sense amplifier enable signal (e.g., SAEN) to the sense amplifier block 206, a master clock signal (e.g., MSTCLK) to the output register block 208 and a slave clock signal (e.g., SLVCLK) to the output register block 208.

The sense amplifier evaluation block 212 generally presents the signal SAEVAL that may be at a first state when the sense amplifier block 206 has completed sensing the data from the memory array block 204 and may be at a second state when the sense amplifier block 206 is ready to sense data. The control block 216 may generate the clock signals MSTCLK and SLVCLK in response to the signal SAEVAL. The output register block 208 generally captures the signal SAOUT when the signal MSTCLK is activated. The output register block 208 may present the signal REGOUT when the signal SLVCLK is activated. The signal SAOUT is generally captured in the output register after the sense amplifier block 206 has sensed the memory array block 204 outputs (e.g., TBUS). Once the sense amplifier block 206 evaluates correctly, the output register may be isolated from the sense amplifier block 206 due to the state of the signals MSTCLK and SLVCLK. As a result, the overall bitline noise sensitivity of the circuit 200 may be reduced since a collapsed TBUS signal will not generally be captured by the output register block 208.

Figure 6:
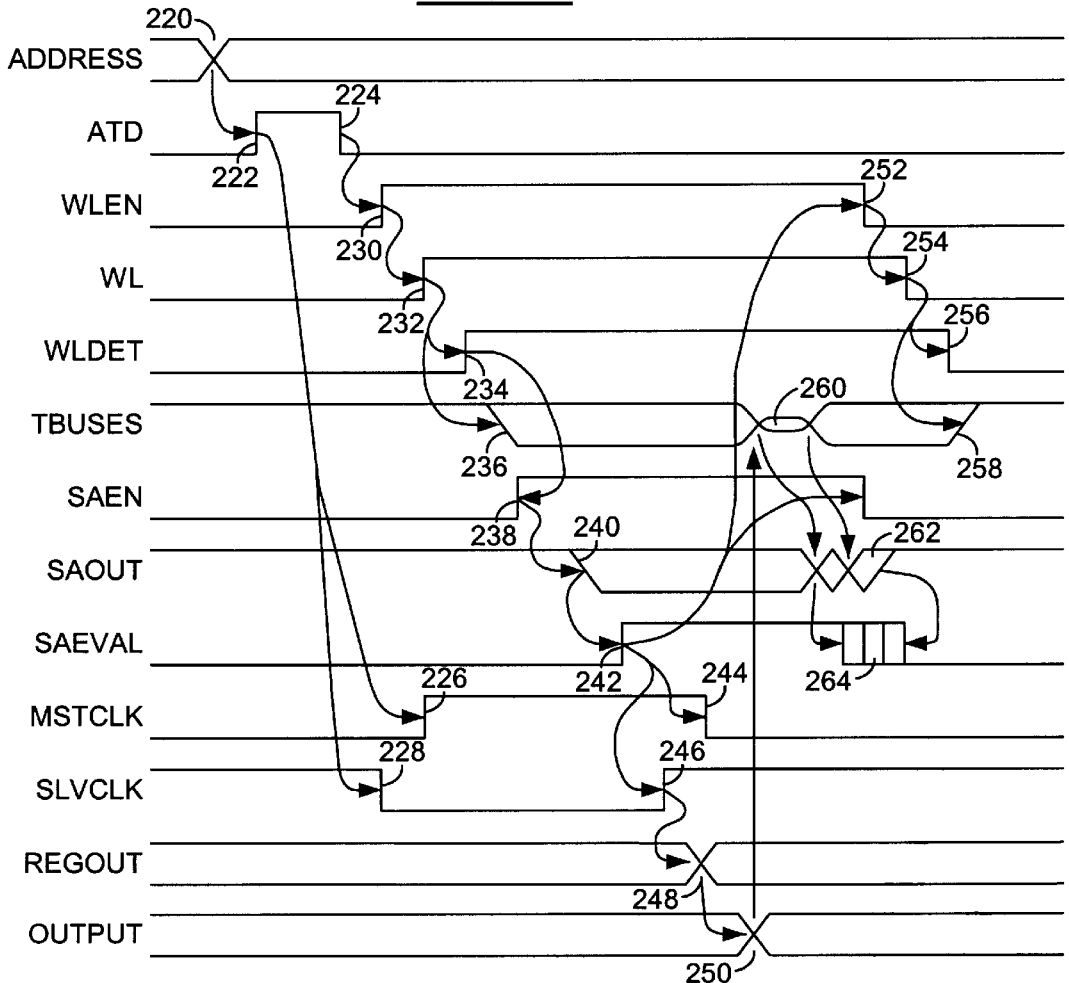
FIG. 6 is a timing diagram of the circuit of FIG. 5.

Referring to FIG. 6, a timing diagram of the various waveforms of FIG. 5 is shown. The signal ADDRESS has a transition 220. The signal ATD has a positive transition 222 that may respond to the transition 220 of the signal ADDRESS. The signal ATD also has a negative transition 224. The signal MSTCLK has a positive transition 226 that generally responds to the positive transition 222 of the signal ATD. The signal SLVCLK has a negative transition 228 that generally responds to the positive transition 222 of the signal ATD. The signal WLEN may have a positive transition 230 that may respond to the negative transition 224 of the signal ATD. The signal WL may have a positive transition 232 that may respond to the positive transition 230 of the signal WLEN. The signal WLDET has a positive transition 234 that may respond to the positive transition 232 of the signal WL. The signal TBUS has a transition 236 that may respond to the transition 232 of the signal WL. The signal SAEN has a positive transition 238 that may respond to the positive transition 234 of the signal WLDET. The signal SAOUT has a transition 240 that may respond to the transition 238 of the signal SAEN. The signal SAEVAL has a positive transition 242 that may respond to the transition 240 of the signal SAOUT. The signal MSTCLK has a negative transition 244 that may respond to the positive transition 242 of the signal SAEVAL. The signal SLVCLK has a positive transition 246 that may respond to the positive transition 242 of the signal SAEVAL. The signal REGOUT has a transition 248 that may respond to the positive transition 246 of the signal SLVCLK. The signal OUTPUT has a transition 250 that may respond to the transition 248 of the signal REGOUT. Since the transition 248 and the transition 250 may respond to the positive transition 246 of the signal SLVCLK, the data read from the memory array 204 is generally valid. Any glitching that may occur in response to the transition 250 on the signal OUTPUT does not generally effect the operation of the circuit 200, since the signal REGOUT responds to the signal SLVCLK and does not generally respond to the signal SAOUT while the signal SLVCLK is active.

The signal WLEN has a negative transition 252 that may respond to the positive transition 242 of the signal SAEVAL.

The signal WL has a negative transition 254 that may respond to the negative transition 252 of the signal WLEN. The signal WLDET has a negative transition 256 that may respond to the negative transition 254 of the signal WL. The signal TBUS has a transition 258 that may respond to a negative transition 254 of the signal WL. The signal TBUS has a collapsed differential voltage state 260 that may respond to the transition 250 of the signal OUTPUT. The signal SAOUT may have an unstable state 262 that may respond to the low differential condition 260. A signal SAEVAL may have an unstable state 264 that may respond to the unstable state 262. The unstable states 262 and 264 do not generally affect the signal OUTPUT, since the signal OUTPUT responds to the signal REGOUT, which is not generally affected by the conditions 260, 262 or 264.

Figure 7:
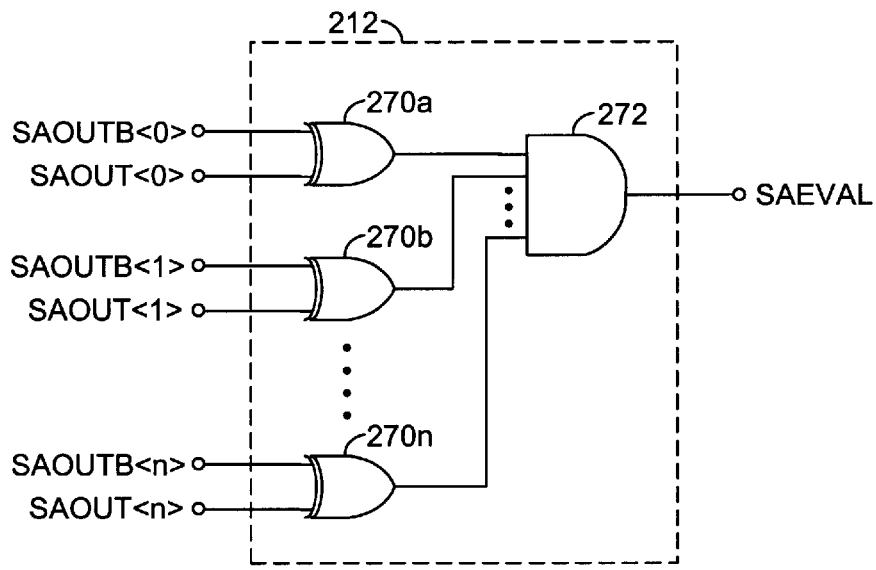
FIG. 7 is a sense amplifier evaluation block of FIG. 5.

Referring to FIG. 7, a circuit diagram of the sense amplifier evaluation circuit 212 is shown. The sense amplifier evaluation circuit 212 generally comprises a number of gates 270a–270n and a gate 272. The gates 270a–270n may be implemented, in one example, as exclusive OR gates. The gate 272 may be implemented, in one example, as an AND gate. Each of the gates 270a–270n may receive a signal SAOUT and a signal SAOUTB. When the signal SAOUT and the signal SAOUTB are different values, a "1" may be presented to an input of the AND gate 272. When all of the gates 270a–270n present a "1", the gate 272 generally presents a "1" as the signal SAEVAL. A more detailed description of the sense amplifier evaluation circuit 212, as well as alternate implementations, may be found in co-pending application, attorney docket number 0325.00177, filed on Jun. 24, 1998, which is hereby incorporated by reference in its entirety.

Figure 8:
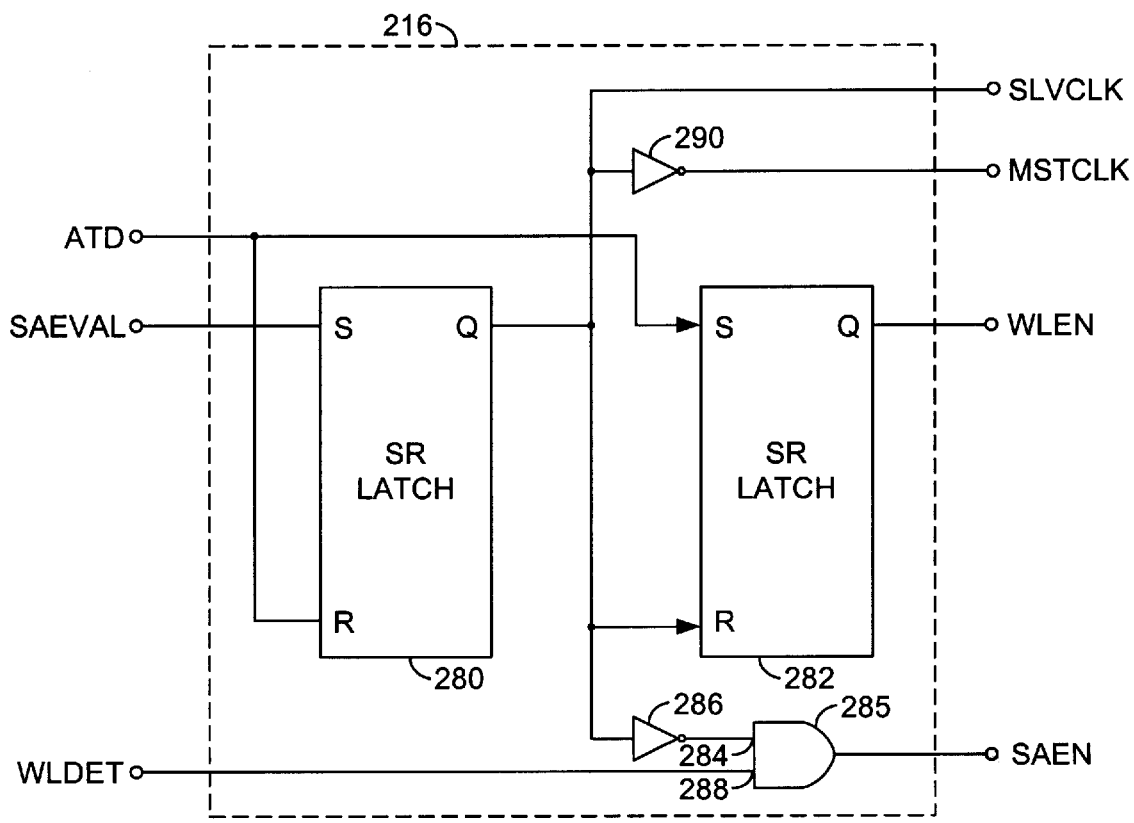
FIG. 8 is a circuit diagram of the control circuit of FIG. 5.

Referring to FIG. 8, a more detailed diagram of the control circuit 260 is shown. The control circuit 260 generally comprises a latch 280 and a latch 282. The latches 280 and 282 may be implemented, in one example, as a set-reset (SR) latches. The signal SAEVAL may be presented to a set input of the latch 280. The signal ATD may be presented to a reset input of the latch 280. The output of the latch 280 may be presented to a reset input of the latch 282 as well as to an input 284 of a gate 285, through an inverter 286. An input 288 of the gate 285 may receive the signal WLDET. The gate 285 may present the signal SAEN. The latch 282 may have a set input that may receive the signal ATD. The latch 282 generally presents the signal WLEN. The output of the latch 280 generally presents the signal SLVCLK and the signal MSTCLK, through an inverter 290.

While the invention has been particularly shown and described with reference to the preferred embodiments thereof, it will be understood by those skilled in the art that various changes in form and details may be made without departing from the spirit and scope of the invention.

We claim:

1. A circuit comprising:
   a sense amplifier configured to present a first output and a second output in response to (i) an input signal and (ii) an enable signal;
   an evaluation circuit configured to present an evaluation signal in response to said first and second outputs;
   a control circuit configured to present (i) a first clock, (ii) a second clock and (iii) said enable signal in response to (i) said evaluation signal and (ii) a wordline signal; and
   a register circuit configured to hold either said first or second outputs in response to said first and second clocks.

2. The circuit according to claim 1, wherein said control circuit comprises a first latch configured to generate said first clock and a second clock.

3. The circuit according to claim 2, wherein said register loads either said first or second outputs in response to said first clock and presents either said first or said second output in response to said second clock.

4. The circuit according to claim 1, wherein said enable signal has a first state that enables said sense amplifier and a second state that disables said sense amplifier.

5. The circuit according to claim 1, further comprising a plurality of sense amplifiers each having a first and a second sense amplifier output.

6. The circuit according to claim 5, wherein said control circuit presents said evaluation signal in response to each of said first and second sense amplifier outputs having a different state.

7. The circuit according to claim 5, wherein said control circuit presents a plurality of evaluation signals, each in response to one of said sense amplifier outputs.

8. The circuit according to claim 1, wherein said input signal is generated from a memory array.

9. A circuit comprising:
   means for generating a first and a second output in response to (i) an input signal and (ii) an enable signal;
   means for generating an evaluation signal in response to said first and second outputs;
   means for generating (i) said first clock signal, (ii) a second clock signal and (iii) said enable signal in response to (i) said evaluation signal and (ii) a wordline signal; and
   means for holding either said first or said second output in response to said first and second clock signals.

10. A method for reducing and/or eliminating small signal voltage swing sensitivity in a memory comprising the steps of:
   (A) generating a first and a second sense amplifier output in response to (i) an input signal and (ii) an enable signal;
   (B) generating an evaluation signal in response to said first and second sense amplifier outputs;
   (C) generating (i) a first clock signal, (ii) a second clock signal and (iii) said enable signal in response to (i) said evaluation signal and (ii) a wordline signal; and
   (D) holding either said first or said second output in response to said first and second clock signals.

11. The method according to claim 10, wherein said evaluation signal is generated when said first and said second sense amplifier outputs are at different states.

12. The method according to claim 10, wherein said enable signal has a first state that enables said sense amplifier and a second state that disables said sense amplifier.

13. The method according to claim 11, wherein step (A) generates a plurality of said first and second sense amplifier outputs.

14. The method according to claim 10, wherein step (B) generates a plurality of said evaluation signals, each in response to said first and second sense amplifier outputs being at a different state.

15. The method according to claim 13, wherein step (B) generates said evaluation signal in response to either said first or said second sense amplifier output having an active state.

16. The circuit according to claim 1, wherein said circuit reduces and/or eliminates signal voltage swing sensitivity.

17. The circuit according to claim 10, wherein said circuit reduces and/or eliminates signal voltage swing sensitivity.

* * * * *